(12) United States Patent
Mugiraneza et al.

(10) Patent No.: US 10,416,820 B2
(45) Date of Patent: Sep. 17, 2019

(54) DISPLAY DEVICE

(71) Applicant: Sharp Kabushiki Kaisha, Sakai, Osaka (JP)

(72) Inventors: Jean Mugiraneza, Sakai (JP); Yasuhiro Sugita, Sakai (JP); Kazutoshi Kida, Sakai (JP); Hiroyuki Ogawa, Sakai (JP); Tomohiro Kimura, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 7 days.

(21) Appl. No.: 15/517,575

(22) PCT Filed: Oct. 5, 2015

(86) PCT No.: PCT/JP2015/078239
§ 371 (c)(1),
(2) Date: Apr. 7, 2017

(87) PCT Pub. No.: WO2016/056516
PCT Pub. Date: Apr. 14, 2016

(65) Prior Publication Data
US 2017/0308200 A1    Oct. 26, 2017

(30) Foreign Application Priority Data
Oct. 10, 2014    (JP) ................. 2014-208754

(51) Int. Cl.
*G06F 3/045*    (2006.01)
*G06F 3/041*    (2006.01)
(Continued)

(52) U.S. Cl.
CPC .......... *G06F 3/044* (2013.01); *G02F 1/13338* (2013.01); *G02F 1/134336* (2013.01); *G06F 3/0416* (2013.01); *H03K 17/955* (2013.01); *H03K 17/962* (2013.01); *G06F 2203/04108* (2013.01); *G06F 2203/04111* (2013.01)

(58) Field of Classification Search
CPC ....... G06F 3/044; G06F 3/0416; G06F 3/0412
See application file for complete search history.

(56) References Cited

U.S. PATENT DOCUMENTS

| 2010/0134423 | A1  | 6/2010 | Brisebois et al. |
| 2011/0140720 | A1* | 6/2011 | Kurashima ............. G06F 3/044 |
| | | | 324/686 |

(Continued)

FOREIGN PATENT DOCUMENTS

JP    2011-175335 A    9/2011

OTHER PUBLICATIONS

Official Communication issued in International Patent Application No. PCT/JP2015/078239, dated Nov. 24, 2015.

*Primary Examiner* — Nan-Ying Yang
(74) *Attorney, Agent, or Firm* — Keating & Bennett, LLP

(57) ABSTRACT

A display device is provided in which a configuration of first electrodes (4) in a first area (R1) that overlaps a display area (AA) of a touch panel (2), and a configuration of first electrodes (6) in a second area (R2) outside the first area, are different from each other. In the second area (R2), at least one electrode pad (6-1a, 6-2a) of the first electrodes (6) is arranged so as to be opposed to one second electrode (7a).

5 Claims, 15 Drawing Sheets

(51) Int. Cl.
  *G06F 3/044* (2006.01)
  *G02F 1/1333* (2006.01)
  *G02F 1/1343* (2006.01)
  *H03K 17/955* (2006.01)
  *H03K 17/96* (2006.01)

(56) References Cited

U.S. PATENT DOCUMENTS

| | | |
|---|---|---|
| 2011/0205172 A1 | 8/2011 | Kitada |
| 2011/0261010 A1* | 10/2011 | Nishitani ................ G06F 3/044 |
| | | 345/174 |
| 2012/0268422 A1 | 10/2012 | Hirakawa et al. |
| 2013/0069886 A1* | 3/2013 | Wang .................... G06F 3/0416 |
| | | 345/173 |
| 2013/0300697 A1 | 11/2013 | Kim et al. |
| 2015/0160760 A1* | 6/2015 | Sato ........................ G06F 3/044 |
| | | 345/174 |

\* cited by examiner

DISPLAY DEVICE

TECHNICAL FIELD

The present disclosure relates to a technique of detecting contact or approach of an object, used in a display device having a touch panel.

BACKGROUND ART

A display device such as, for example, a smartphone or a tablet includes a touch panel (referred to as a touch sensor or a touch screen in some cases). The touch panel has electrodes for detecting contact or approach of an object. With such a touch panel, a user interface that enables an input operation with respect to an image displayed on a display device can be realized.

In recent years, a variety of forms of user interfaces have been proposed. For example, the specification of US Patent Application Publication No. 2010/0134423 discloses that a sensor is arranged on an edge of an apparatus so that the apparatus can determine whether the apparatus is in the left hand and/or the right hand of the user. Further, the specification of US Patent Application Publication No. 2013/0300697 discloses a bended display that enables operations with respect to a main area of a front surface of a portable device and a sub area of a side surface of the portable device.

PRIOR ART DOCUMENT

Patent Document

Patent Document 1: US Patent Application Publication No. 2010/0134423
Patent Document 2: US Patent Application Publication No. 2013/0300697

SUMMARY OF THE INVENTION

Problem to be Solved by the Invention

On a touch panel, electrodes for detecting an object are arranged in an area that overlaps a display area. In an area outside the area that overlaps the display area, for example, in a frame area, electrodes for detecting an object can be arranged as well. This makes it possible to detect contact or approach of an object outside the display area as well. In the area outside the area that overlaps the display area, however, lead-out lines that connect the electrodes arranged in the area that overlaps the display area with a signal processing unit are also arranged additionally in many cases. If many constituent elements such as electrodes and lines are arranged on the touch panel, outside the area that overlaps the display in this way, narrowing the frame is inhibited, the detection performance in an area outside the display area is limited, and this also causes the complication of the production process, the materials, the configuration, the processing process, and the like. This was found by the inventors of the present invention. To cope with these, the specification of the present application discloses a technique for arranging constituent elements of a touch panel efficiently in an area outside an area that overlaps the display area.

Means to Solve the Problem

A display device of the present disclosure includes a display panel that has a display area that displays an image, and a touch panel stacked on the display panel. The touch panel includes: a plurality of first electrodes that extend in a first direction; a plurality of second electrodes that extend in a second direction that intersects with the first direction; and a control unit that detects contact or approach of an object by detecting capacitances between the first electrodes and the second electrodes. In the touch panel, a shape of the first electrode in a first area that overlaps the display area, and a shape of the first electrode in a second area outside the first area, are different. In the second area, the first electrode includes at least one electrode pad, and the electrode pad is arranged so as to be opposed to one of the second electrodes.

Effect of the Invention

According to the present disclosure, constituent elements of a touch panel can be arranged efficiently in an area outside an area that overlaps a display area.

EMBODIMENTS

Figure 1:
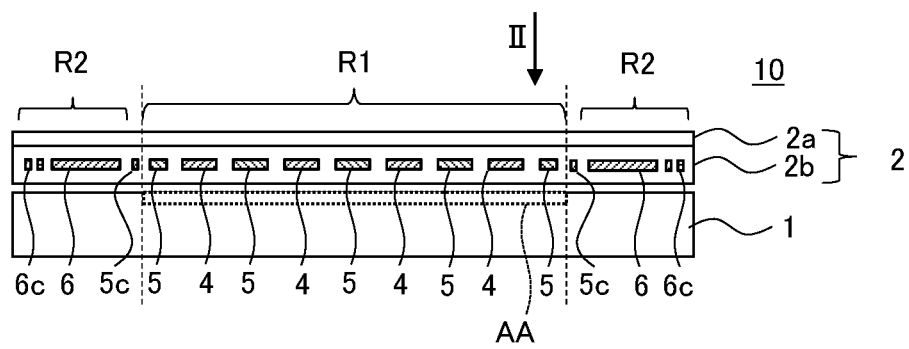
FIG. 1 is a cross-sectional view illustrating an exemplary configuration of a display device in Embodiment 1.

A display device according to one embodiment of the present invention includes a display panel that has a display area that displays an image, and a touch panel stacked on the display panel. The touch panel includes: a plurality of first electrodes that extend in a first direction; a plurality of second electrodes that extend in a second direction that intersects with the first direction; and a control unit that detects contact or approach of an object by detecting capacitances between the first electrodes and the second electrodes or respective capacitances of the first electrodes and the second electrodes. In the touch panel, a shape of the first electrode in a first area that overlaps the display area, and a shape of the first electrode in a second area outside the first area, are different. In the second area, the first electrode includes at least one electrode pad, and the electrode pad is arranged so as to be opposed to one of the second electrodes. This makes it possible to efficiently arrange the first and second electrodes in the second area. This therefore makes it possible to efficiently arrange constituent elements of the touch panel in an area outside an area that overlaps the display area.

In the second area, the first electrode may include two or more electrode pads. In this case, in the second area, the two or more electrode pads of the first electrode can be arranged so as to be opposed to one of the second electrodes. The two or more electrode pads of the first electrode, which are arranged so as to be opposed to one of the second electrodes in the second area, are connected through individually provided lines, respectively, to the control unit. This allows the two or more first electrodes controlled through different lines to be arranged so as to be opposed to one second electrode in the second area. This therefore enables more efficient electrode arrangement in the second area.

The two or more electrode pads of the first electrode, which are arranged so as to be opposed to one of the second electrodes in the second area, can be arrayed in the first direction. In this configuration, in the second area, the two or more electrode pads of the first electrode, which are opposed to the one of the second electrodes, are arranged in the first direction. These electrode pads of the first electrode are connected with the control unit respectively through independent lines. With this configuration, signals input to or output from the electrode pads of the first electrode can be controlled or processed separately. In other words, regarding one second electrode, capacitances corresponding to two or more positions in the first direction can be detected. This makes it possible to increase the capacitance detection points in the first direction, without increasing the second electrodes. This therefore makes it possible to efficiently arrange the constituent elements of the touch panel in an area outside an area that overlaps the display area.

In the above-described configuration, at least one of the second electrodes can be formed so as to extend from an inner side of the first area toward the second area, and two or more electrode pads of the first electrode can be arrayed in the first direction so as to be opposed to the second electrode extending toward the second area. This provides such a configuration that at least part of the second electrodes in the first area are connected with at least part of the second electrodes in the second area. In other words, in the first area and in the second area, at least part of the electrodes for detecting an object can be shared. This makes it possible to reduce the members of the touch panel. Further, this makes it easier to detect a series of actions of an object across the first area and the second area.

The above-described configuration can be such that, in the first area, the two or more electrode pads of the first electrode are arrayed in the first direction so as to be opposed to one of the second electrodes, and the two or more electrode pads of the first electrode in the first area are connected to one line that extends in the first direction. This allows the detection accuracy in the first direction in the first area, and the detection accuracy in the first direction in the second area, to be different. This therefore makes it possible that, for example, in both of the first area and the second area, respective detection properties suitable for the object detection in the respective areas can be realized.

The above-described configuration can be such that a material of the first electrodes or the second electrodes in the first area is different from a material of the first electrodes or the second electrodes in the second area. This allows the first area and the second area to have different detection properties. This therefore makes it possible to achieve appropriate detection properties respectively in the first area and the second area.

The above-described configuration can be such that the control unit detects the capacitances between the first electrodes and the second electrodes by a mutual capacitance method in the first area, and detects the capacitances of the first electrodes and the second electrodes by a self-capacitance method in the second area. This makes it possible that in the second area, detection performance different from that in the first area can be achieved. For example, in the first area, contact of an object is detected, and in the second area, detection (hover detection) of an object at a position separated from the display device surface, fingerprint detection, and the like can be performed.

The above-described configuration may be such that the display device further includes third electrodes that are provided so as to be opposed to the first electrodes or the second electrodes, in the second area. This makes it possible to, for example, add a function of detecting an object based on capacitances between the third electrodes and the first electrodes or the second electrodes. Alternatively, the third electrodes and the first electrodes or the second electrodes can be caused to function as electrodes for a sensor other than the touch panel. With this, the complication of the configuration in the second area can be suppressed, the object detection performance can be enhanced, and another sensor function can be added.

The embodiments of the present invention encompass various types of electronic apparatuses equipped with the above-described display device.

The following describes embodiments of the present invention in detail, while referring to the drawings. Identical or equivalent parts in the drawings are denoted by the same reference numerals, and the descriptions of the same are not repeated. To make the description easy to understand, in the drawings referred to hereinafter, the configurations are simplified or schematically illustrated, or a part of constituent members are omitted. Further, the dimension ratios of the constituent members illustrated in the drawings do not necessarily indicate the real dimension ratios.

Embodiment 1

Exemplary Configuration of Touch Panel

Figure 2:
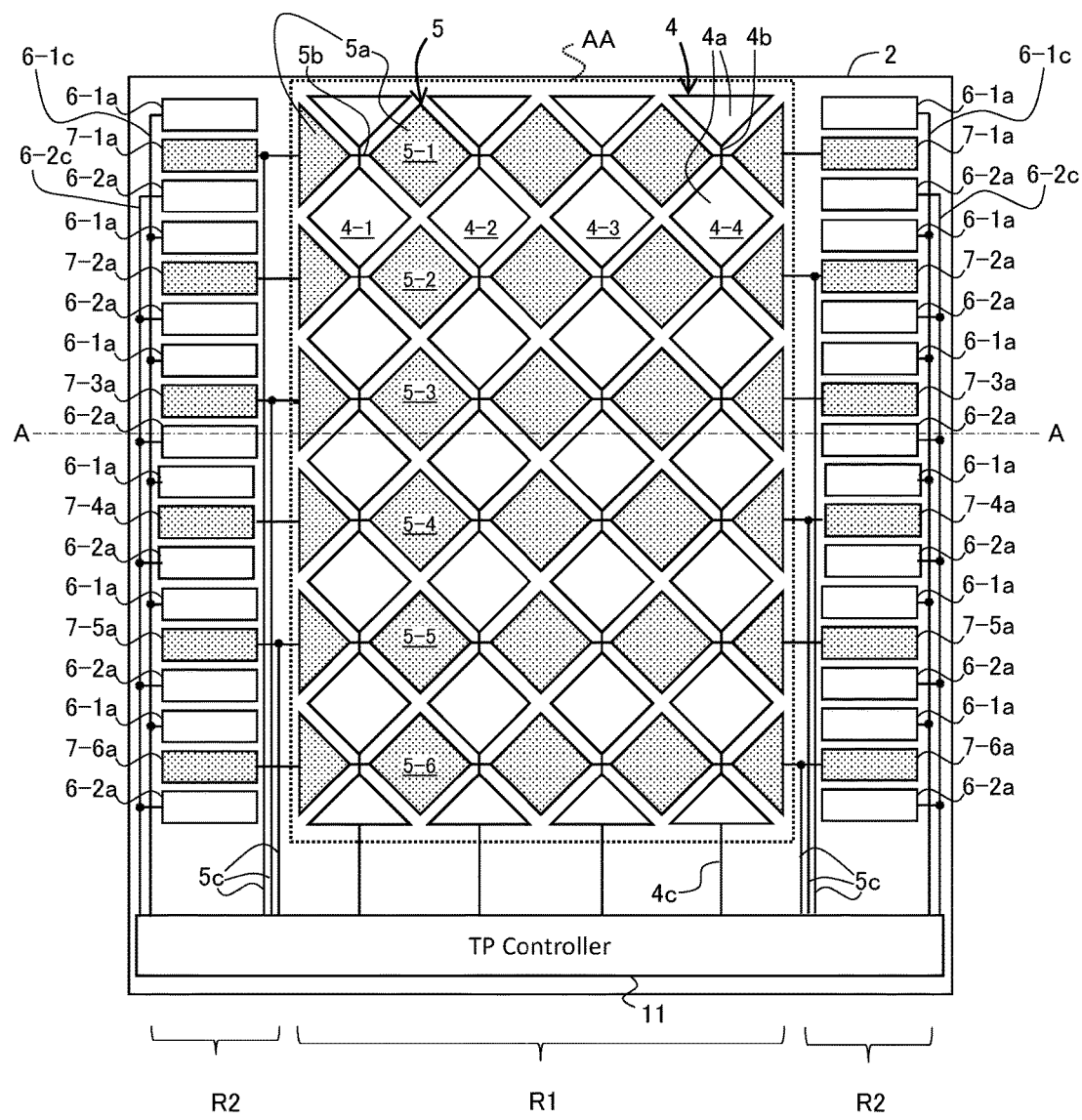
FIG. 2 is a plan view illustrating an exemplary configuration of a touch panel 2 in FIG. 1, viewed in the direction indicated by arrow II.

FIG. 1 is a cross-sectional view illustrating an exemplary configuration of a display device 10 in Embodiment 1. FIG. 2 is a plan view illustrating an exemplary configuration of a touch panel 2 in FIG. 1, viewed in the direction indicated by arrow II. FIG. 1 illustrates a cross section taken along line A-A in FIG. 2.

In the example illustrated in FIG. 1, the display device 10 includes a display panel 1, and a touch panel 2 stacked on the display panel 1. The display panel 1 has a display area AA in which an image is displayed. The display area AA is an area where pixels for displaying an image are arranged. The display panel 1 may be in the form of, for example, a liquid crystal panel, though it is not limited particularly. The liquid crystal panel includes an active matrix substrate, a counter substrate, and a liquid crystal layer provided between the active matrix substrate and the counter substrate.

The touch panel 2 is stacked on the display panel 1 so as to cover the display area AA. Light outgoing from pixels of the display area AA passes through the touch panel 2, and outgoes from the surface of the touch panel 2. In the example illustrated in FIG. 1, an air gap is provided between the display panel 1 and the touch panel 2.

As illustrated in FIGS. 1 and 2, the touch panel 2 includes a transparent substrate 2b, first electrodes 4, 6, second electrodes 5, 7, and a transparent cover 2a. The first electrodes 4, 6 and the second electrodes 5, 7 are provided on the transparent substrate 2b. The transparent cover 2a is provided so as to cover the first electrodes 4, 6 and the second electrodes 5, 7. By detecting a capacitance between these first and second electrodes, the touch panel 2 detects contact or approach of an object such as a finger, a pen, or the like.

In the example illustrated in FIG. 2, on the touch panel 2, in an area R1 that overlaps the display area AA (an example of a first area), a plurality of first electrodes 4 (4-1 to 4-4) extending in a first direction (in the present example, the longitudinal direction of the drawing), and a plurality of second electrodes 5 (5-1 to 5-6) extending in a direction different from the first direction in the area R1 (in the present example, the horizontal direction of the drawing), are arranged. The first electrodes 4 and the second electrode 5 are not electrically connected, and are insulated from each other.

The surface in the area R1 on which the first and second electrodes 4 and 5 are provided, and the surfaces in the areas R2 on which the first and second electrodes 6 and 7 are provided can be parallel to the display surface of the display panel 1. The first and second electrodes 4 and 5 in the area R1 and the first and second electrodes 6 and 7 in the areas R2 are thus formed on an identical surface or parallel surfaces, which prevents the electrode forming steps from becoming complicated.

Each of the first electrodes 4 in the area R1 is formed with a plurality of first electrode pads 4a arrayed in the first direction, and first connection lines 4b that connect adjacent ones of the first electrode pads 4a. Each of the second electrodes 5 in the area R1 is also formed with a plurality of second electrode pads 5a arrayed in the second direction, and second connection lines 5b that connect adjacent ones of the second electrode pads 5a. The first electrode pads 4a and the second electrode pads 5a are arranged so as to be adjacent to each other.

In the example illustrated in FIG. 2, a plurality of rectangular electrode pads 4a and 5a are arranged in a matrix that has rows and columns in the area R1. The first electrode pads 4a arrayed in the longitudinal direction, i.e., the vertical direction, of the display screen form columns. The second electrode pads 5a arrayed in the transverse direction, i.e., the horizontal direction, of the display screen, form rows. In the present embodiment, the first direction is the column direction (longitudinal direction), and the second direction is the row direction (transverse direction). The first electrode 4 of each column is connected to a touch panel controller 11 (TP controller) through a first line 4c. The second electrode 5 of each row is connected to the TP controller 11 through a second line 5c.

The configuration of the first electrode 4 in the area R1, and the configuration of the first electrode 6 in the areas R2 (one example of the second area) outside the area R1, are different. The second electrodes 5 (5-1 to 5-6) in the area R1 are connected to the second electrodes 7 (7-1 to 7-6) in the areas R2 outside the area R1, respectively. In the area R2, each second electrode 7 includes second electrode pads 7-1a to 7-6a (hereinafter referred to as second electrode pads 7a when referred to generally). Respective first electrode pads 6-1a and 6-2a of the two first electrodes 6 are arranged so as to be opposed to one second electrode pad 7a in the first direction. The two first electrode pads 6-1a and 6-2a opposed to the one second electrode pad 7a are arrayed in the first direction. In other words, the two first electrodes 6-1a and 6-2a are arranged on the sides of one second electrode 7a, respectively, in such a manner that one second electrode 7a is interposed between the two first electrodes 6-1a and 6-2a in the first direction.

In the area R2, the two first electrode pads 6-1a and 6-2a opposed to one second electrode pad 7a are connected to different lines 6-1c and 6-2c, respectively. Both of these lines 6-1c and 6-2c extend in the first direction, and are connected to the TP controller 11. In other words, the two first electrode pads 6-1a and 6-2a opposed to the one second electrode pad 7a are connected to the TP controller 11 through the lines 6-1c and 6-2c, which are provided individually. With this configuration, the first electrode 6-1a is connected to the TP controller 11 through the line 6-1c, and the first electrode 6-2a is connected thereto through the line 6-2c. To one line 6-1c, a plurality of the first electrode pads 6-1a are connected. The plurality of first electrode pads 6-1a connected to one line 6-1 are opposed to different second electrode pads 7a, respectively.

The TP controller 11 is an exemplary control unit that detects capacitances between the first electrodes 4, 6 and the second electrodes 5, 7, or respective capacitances of the first electrodes 4, 6 and the second electrodes 5, 7. In the present example, the TP controller 11 controls voltage signals of the first electrodes 4, 6 and the second electrodes 5, 7, so as to detect changes in the capacitances between adjacent ones of the first electrodes 4, 6 and the second electrodes 5, 7. The TP controller 11 is capable of identifying a position of an object that approaches or is in contact with the touch panel 2 based on the detected changes in the capacitances. The TP controller 11 is an exemplary control unit that detects contact or approach of an object based on the capacitances between the first electrodes and the second electrodes. The TP controller can be formed with, for example, a semiconductor chip (not illustrated) that is provided on the touch panel 2, or on an FPC (not illustrated) connected to the touch panel 2.

In the present embodiment, in the area R1, two first electrode pad 4a that are arrayed in the first direction and opposed to one second electrode pad 5a, are connected to one line 4b that extends in the first direction. In contrast, in the area R2, two electrode pads 6-1a and 6-2a that are arrayed in the first direction and opposed to one second electrode pad 7a are connected to two lines 6-1c and 6-2c, respectively, which extend in the first direction. This allows the detection accuracy (resolution) in the first direction in the area R2, and the detection accuracy (resolution) in the second direction in the area R1, to be different.

In the example illustrated in FIG. 2, in a part of the area R2 that corresponds to one row of the second electrode 5 in the area R1, one second electrode pad 7a and two first electrode pads 6-1a and 6-2 opposed to the foregoing electrode pad 7a are provided. These two first electrode pads 6-1a and 6-2a are connected to different lines 6-1c and 6-2c, respectively, and are arranged so as to be arrayed in the first direction. The resolution in the first direction in the area R2, therefore, can be set to around twice the resolution in the first direction in the area R1.

Besides, with the above-described configuration, only a smaller number of lines may be added for improving the resolution. More specifically, in the above-described example, in order to achieve the resolution that is around twice, two lines 6-1c and 6-2c are provided with respect to the first electrode pads 6-1a and 6-2a, in each of the two areas R2 on the right and left sides of the display area AA. Since this results in that one line is added in each of the two areas R2 on the right and left sides, the number of added lines as a whole is only two. In other words, in order to increase the resolution in the first direction in the two areas R2 to n times, it is required to add only 2(n−1) lines. In contrast, for example, in a case where the resolution is increased to n times by increasing the second electrodes 7 in the areas R2, it is required to increase the number of lines to n times. In this way, in some cases, an increase in the number of lines makes forming a narrower frame difficult, or leads to the deterioration of detection performance. On the other hand, with the above-described configuration, there is almost no increase in the number of lines, which makes it possible to achieve a narrower frame while suppressing the deterioration of detection performance.

More specifically, in the area R2, each of the two first electrode pads 6-1a, 6-2a and the second electrode pad 7a has two sides parallel to the second direction, and the second electrode pad 7a and the two first electrode pads 6-1a, 6-2a opposed to the electrode pad 7a are provided in such a manner that sides of the two first electrode pads 6-1a, 6-2a adjacent to the electrode pad 7a are opposed to the above-mentioned two sides of the second electrode pad 7a, respectively. Further, the density at which the first electrode pads 6-1a and 6-2a are arranged in the first direction in the area R2, and the density at which the first electrode pads 4a are arranged in the first direction in the area R1, are different. This allows the area R1 and the area R2 to have further different detection properties.

The materials of the first electrodes 4 and the second electrodes 5 in the area R1, and the materials of the first electrodes 6 and second electrodes 7 in the area R2 may be different. For example, the materials of the first electrode 4, 6 and the second electrode 5, 7 can be selected so that the first electrodes 6 and the second electrodes 7 in the area R2 have lower electric resistances as compared with electric resistances of the first electrodes 4 and the second electrodes 5 in the area R1. In this way, electric properties of the first electrodes 4 and the second electrodes 5 in the area R1 are made different from those of the first electrodes 6 and the second electrodes 7 in the area R2, whereby the object detection properties in the area R1 and those in the area R2 can be made different.

As one example, the first electrodes 4 and the second electrodes 5 in the area R1 can be formed with a transparent conductive material such as ITO. The first electrodes 6 and the second electrodes 7 in the area R2 can be formed with a metal having a lower resistance than that of the transparent conductive material, such as Al, Co, or Mo. Further, the electrodes in the area R2 can be formed with a metal mesh. By using low-resistance lines for the first electrodes 6 and the second electrodes 7 in the area R2 in this way, noise components in the signals passing through the electrodes in the area R2 can be reduced. This enables high-performance detection of an object in the area R2. For example, in the area R2, high-performance and highly-sensitive detection than that in area R1 is enabled. Alternatively, the configuration of the area R2 may be such that hover detection is possible. In the hover detection, the position of an object approaching thereto can be detected without touch on the touch panel 2.

The configuration of the first electrodes 4, 6 and the second electrodes 5, 7 illustrated in FIGS. 1 and 2 are merely an example, and the configuration of the first electrodes and the second electrodes is not limited to that of the above-described example. In the above-described configuration, the second electrode pads 7a and the first electrode pads 6-1a and 6-2a are formed in the same layer in the area R2, and are opposed to each other in the first direction. In contrast, for example, the second electrode pads 7a and the first electrode pads 6-1a and 6-2a may be formed in different layers, and may be opposed to each other with interlayer insulating films being interposed. Similarly, in the area R1 as well, the first electrodes 4 and the second electrodes 5 may be arranged in different layers. Further, the number of second electrode pads arranged so as to be opposed to one second electrode in the area R2 is not limited to two, and three or more second electrode pads may be arranged.

Modification Example 1 of Electrode Configuration

Figure 3:
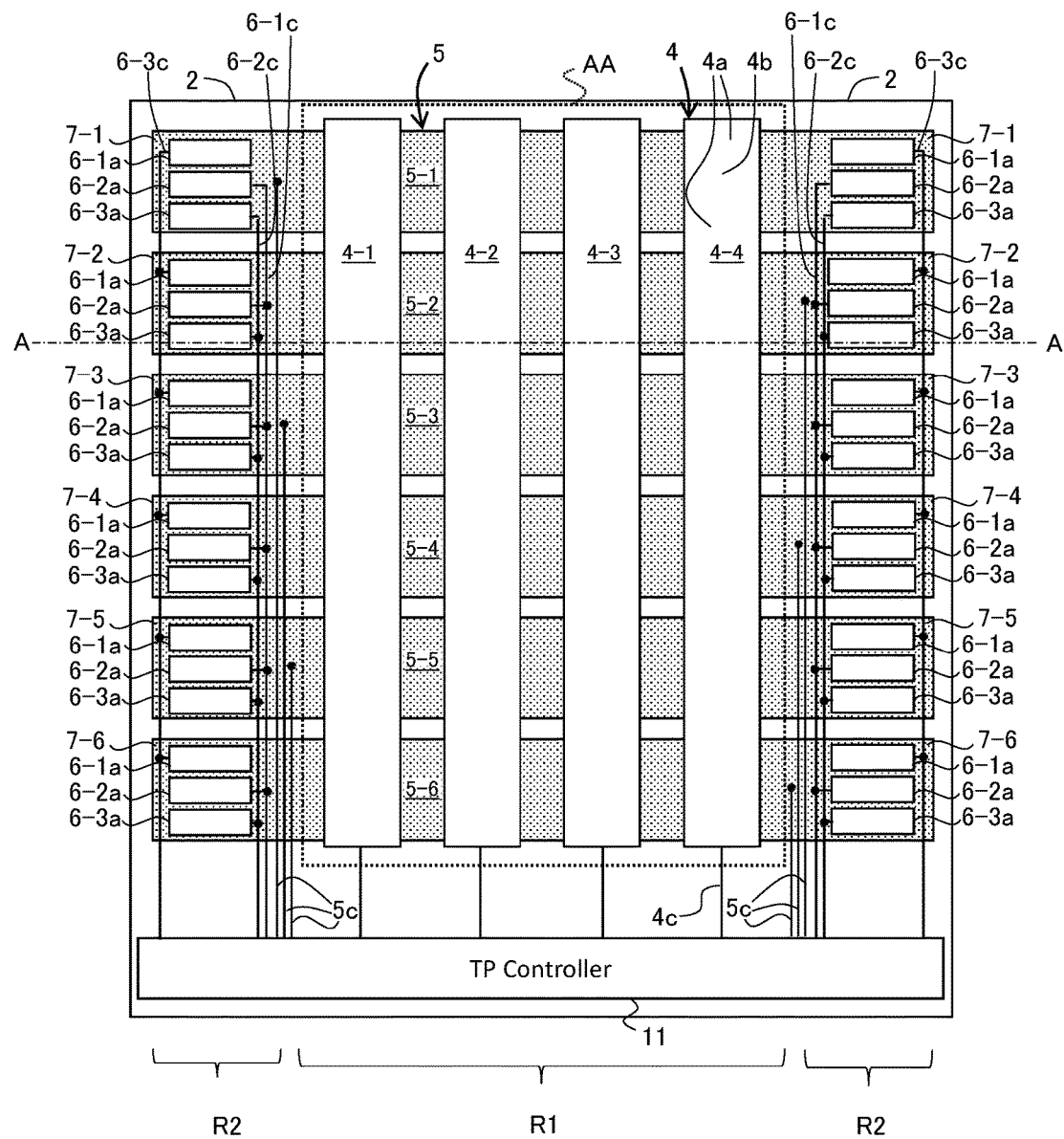
FIG. 3 illustrates a modification example of a configurations of first electrodes and second electrodes in an area R1 and areas R2.
Figure 4:
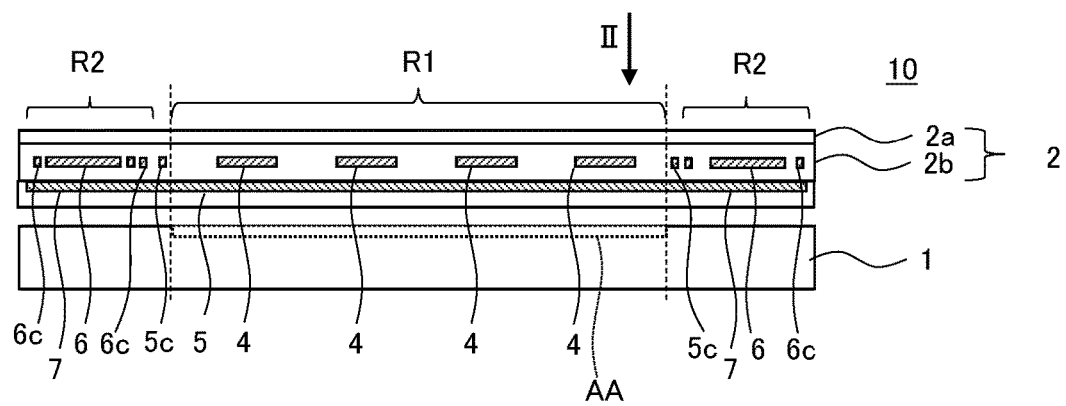
FIG. 4 is a cross-sectional view taken along line A-A in FIG. 3.

FIG. 3 illustrates a modification example of the configurations of the first electrodes and the second electrodes in the area R1 and the areas R2. FIG. 4 is a cross-sectional view taken along line A-A in FIG. 3. In the example illustrated in FIGS. 3 and 4, in the area R1, the first electrodes 4 and the second electrodes 5 are formed in different layers with an insulating layer being interposed therebetween. In the area R2 as well, the first electrodes 6 and the second electrodes 7 are formed in different layers with an insulating layer being interposed therebetween. In the area R1, a plurality of the second electrodes 5 (5-1 to 5-6) extending in the second direction are arrayed in the first direction. An insulating layer is provided so as to cover the first electrodes 5. On this insulating layer, a plurality of the first electrodes 4 (4-1 to 4-4) extending in the first direction are formed so as to intersect with the second electrodes 5, when viewed in a direction vertical to the display surface.

The second electrodes 5 (5-1 to 5-6) in the area R1 extend to the area R2 outside the area R1, thereby forming the second electrodes 7 (7-1 to 7-6) in the area R2. With respect to one second electrode 7 in the area R2, a plurality of first electrode pads 6-1a, 6-2a, and 6-3a are formed at positions that overlap the foregoing second electrode 7 in the direction vertical to the display surface. In other words, with respect to one second electrode 7, a plurality of (three in the present example) electrode pads 6-1a to 6-3a are arranged so as to be opposed to the foregoing second electrode 7 with an insulating layer being interposed therebetween. The electrode pads 6-1a to 6-3a opposed to the one second electrode 7 are arrayed in the first direction. To these electrode pads 6-1a, 6-2a, and 6-3a, different lines 6-1c, 6-2c, and 6-3c are connected, respectively. The lines 6-1c, 6-2c, and 6-3c are connected to the TP controller 11. To one line 6-1c, a plurality of the first electrode pads 6-1a are connected. The first electrode pads 6-1a connected to the one line 6-1c are arranged so as to be opposed to different second electrodes 7, respectively.

In the example illustrated in FIG. 3, in a part of the area R2 that corresponds to one row of the second electrode 5 in the area R1, one second electrode 7 and three first electrode pads 6-1a, 6-2a, and 6-3a opposed to the foregoing second electrode 7 are provided. These three first electrode pads 6-1a, 6-2a, and 6-3a are connected to different lines 6-1c, 6-2c, and 6-3c, respectively, and are arrayed in the first direction. The resolution in the first direction in the area R2, therefore, can be set to around three times the resolution in the first direction in the area R1. In this case, only four lines in total may be added in the two areas R2 on the right and left sides to the area R1.

Modification Example 2 of Electrode Configuration

Figure 5:
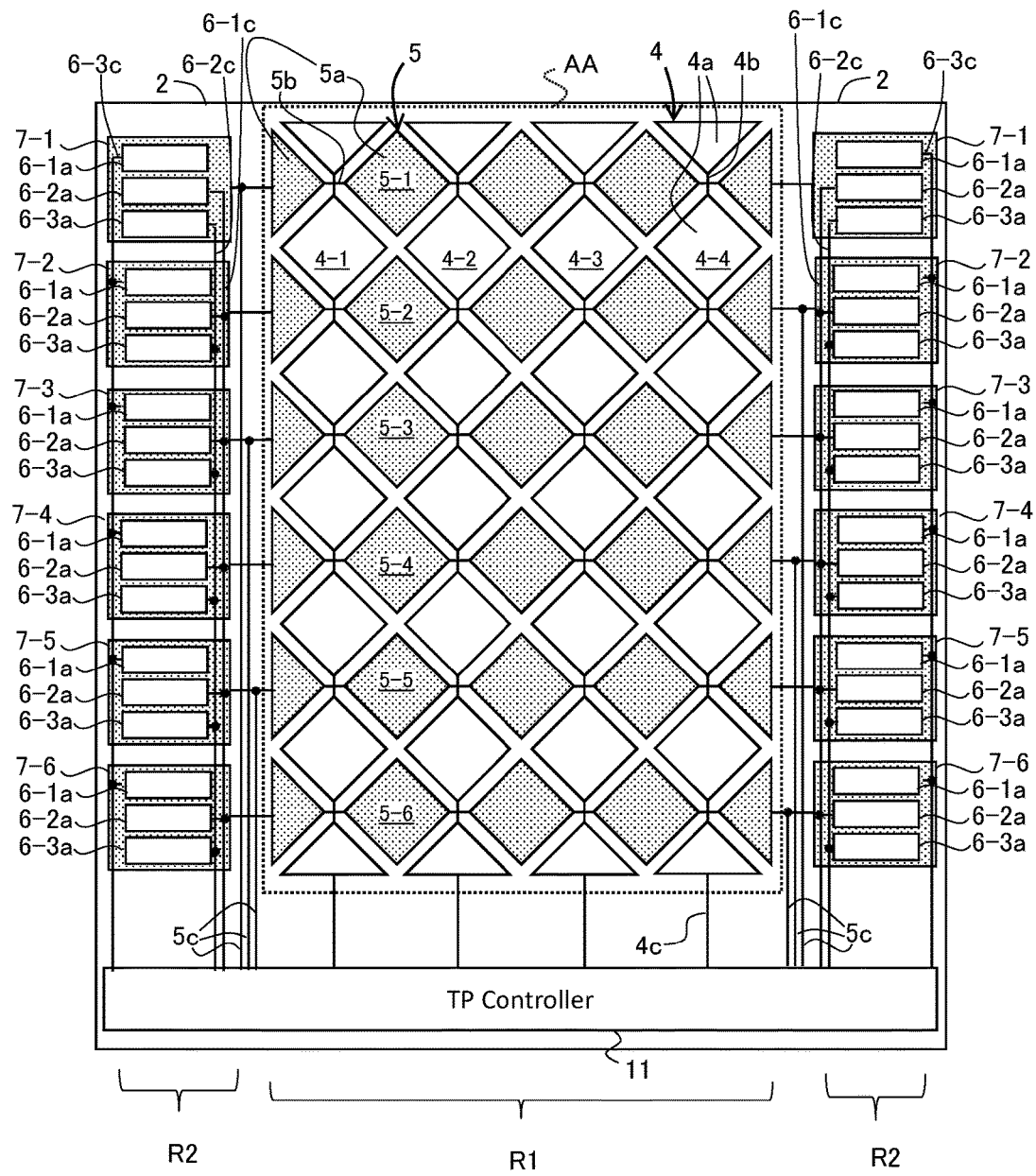
FIG. 5 illustrates another modification example of the configuration of the first electrodes and the second electrodes in the area R1 and the areas R2.

FIG. 5 illustrates another modification example of a configuration of first electrodes and second electrodes in an area R1 and areas R2. In the example illustrated in FIG. 5, the electrode configuration in the area R1 is identical to the configuration of the first electrodes 4 and the second electrodes 5 in the area R1 illustrated in FIG. 2. In the area R2, the second electrodes 7-1 to 7-6 and the first electrode pads 6-1a, 6-2a, and 6-3a are formed in different layers with an insulating layer being interposed therebetween. With respect to one second electrode 7-1, three first electrode pads 6-1a, 6-2a, and 6-3a arrayed in the first direction are provided so as to be opposed to the second electrode 7-1. These three first electrode pads 6-1a, 6-2a, and 6-3a are connected to different lines 6-1c, 6-2c, and 6-3, respectively. The first electrodes 6-1a to 6-3a in the area R2 and the lines 6-1c to 6-3c connected thereto can be formed in the same manner as illustrated in FIG. 3.

Thus, the first electrodes and the second electrodes are formed so that the patterns thereof in the area R1 and in the area R2 are different as illustrated in FIG. 5, whereby the detection performance in the area R1 and the detection performance in the area R2 can be made different from each other. For example, by making the patterns of the first electrodes and the second electrodes different, the properties of signals detected by the first electrodes or the second electrodes can be made different.

Detailed Modification Examples of First Electrodes 6 in Area R2

Figure 6A:
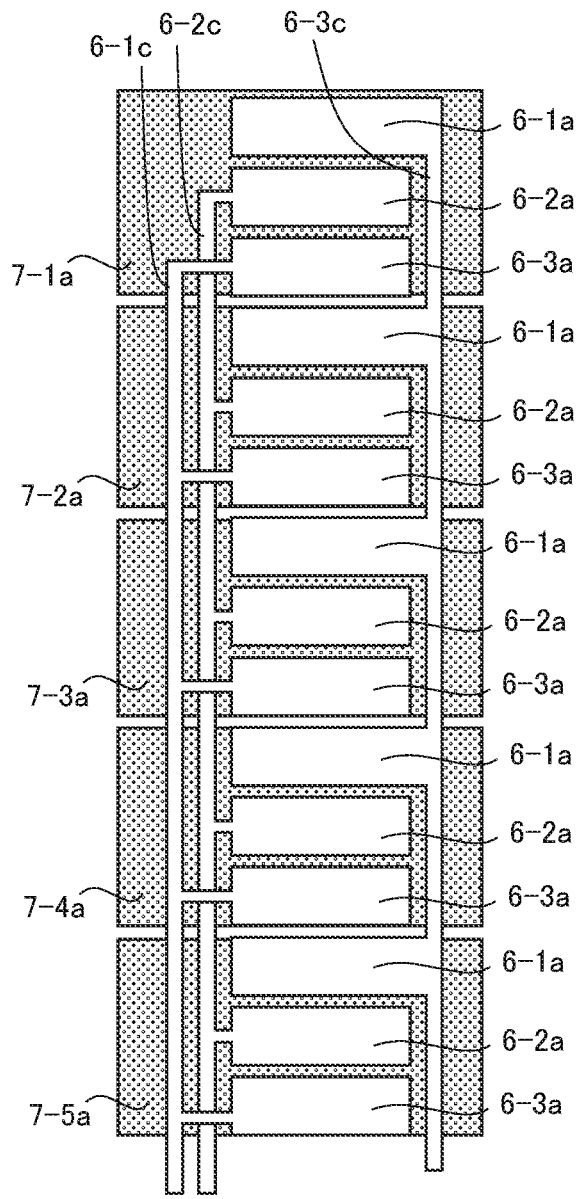
FIG. 6A illustrates a detailed exemplary configuration of the first electrodes 6 in the area R2.

FIG. 6A illustrates a detailed exemplary configuration of first electrodes 6 in the area R2. In the example illustrated in FIG. 6A, in an area that overlaps one second electrode 7-1a in plan view, three first electrode pads 6-1a, 6-2a, and 6-3a arrayed in the first direction are provided. Each of the first electrode pads 6-1a, 6-2a, and 6-3a is formed in a rectangular shape having long sides extending in the second direction. To a short side on one side of the first electrode pad 6-1a, a line 6-3c is connected. The line 6-3c extends in the first direction, and is connected to a plurality of the first electrode pads 6-1a that are opposed to the other second electrodes 7-2a to 7-5a, respectively. In other words, the plurality of first electrode pads 6-1a opposed to the individual second electrodes 7-2a to 7-5a, respectively, are arrayed in the first direction, and are connected to the one line 6-1c. To short sides of the first electrode pads 6-2a and 6-3a on the side opposite to the sides thereof connected to the line 6-1c, the lines 6-2c and 6-3c are connected, respectively. The lines 6-2c and 6-3c extend in the first direction. The lines 6-2c and 6-3c are connected to a plurality of first electrode pads 6-2a and 6-3a, respectively, the first electrode pads 6-2a being opposed to the individual second electrodes 7-1a to 7-5a, respective, and so being the first electrode pads 6-3a. The line 6-2c and the line 6-3c are not electrically connected, and are insulated from each other.

Figure 6B:
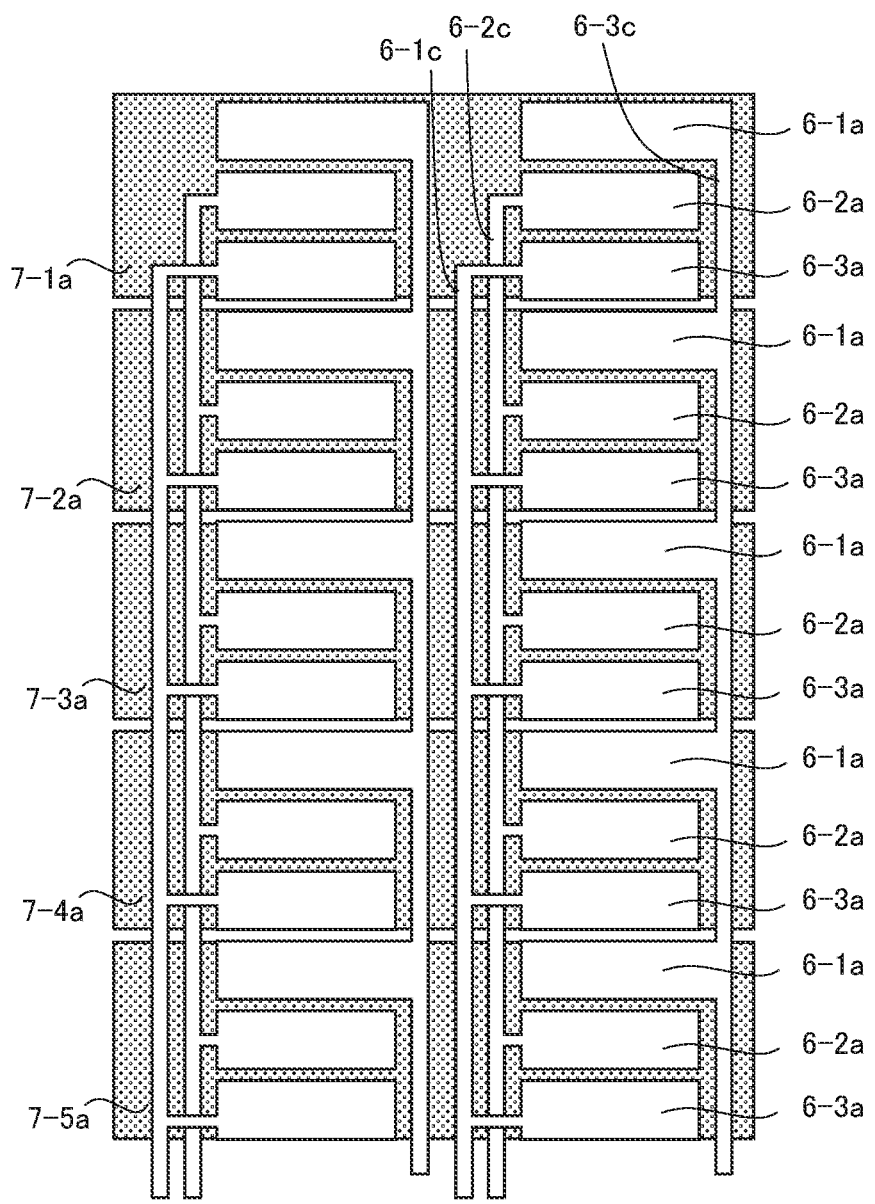
FIG. 6B illustrates an exemplary case where two columns of the first electrode pads 6-1a, 6-2a, and 6-3a illustrated in FIG. 6A are provided.

FIG. 2, FIG. 3, FIG. 5 and FIG. 6A illustrate examples in which the first electrode pads 6 of one column are arranged in the area R2, but the arrangement of the first electrode pads 6 is not limited to this. For example, the first electrode pads 6 of two or more columns can be arranged in the area R2. As one example, FIG. 6B illustrates an example in which the first electrode pads 6-1a, 6-2a, and 6-3a illustrated in FIG. 6A are arranged in two columns. In the example illustrated in FIG. 6B, with respect to one second electrode 7-1a extending in the second direction, two columns each of which is composed of three first electrode pads 6-1a, 6-2a, and 6-3a opposed to the second electrode 7-1a, as well as the lines 6-1c, 6-2c, 6-3c thereof, are formed so as to be arrayed in the second direction.

Further, the number of the first electrode pads in the area R2 that are opposed to one second electrode 7a and are arrayed in the first direction is not limited to two or three as is the case with the above-described examples. For example, four or more first electrode pads may be arranged so as to be opposed to one second electrode 7a and arrayed in the first direction.

Figure 7A:
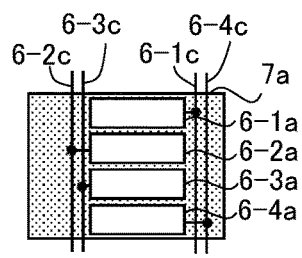
FIG. 7A illustrates an exemplary modification of the first electrode pads.
Figure 7B:
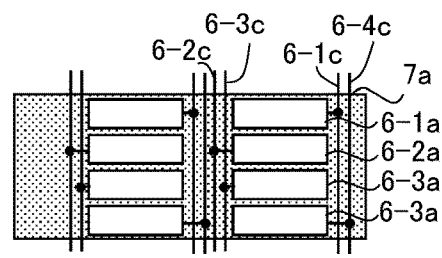
FIG. 7B illustrates another exemplary modification of the first electrode pads.

As one example, FIG. 7A illustrates a configuration in which four first electrode pads 6-1a to 6-4a opposed to one second electrode 7a are arrayed in the first direction in an area that overlaps the second electrode 7a in plan view. FIG. 7B illustrates a configuration in which two columns each of which is composed of the first electrode pads 6-1a to 6-4a illustrated in FIG. 7A are arrayed in the second direction.

Figure 7C:
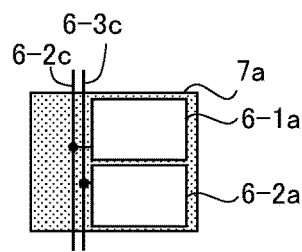
FIG. 7C illustrates still another exemplary modification of the first electrode pads.
Figure 7D:
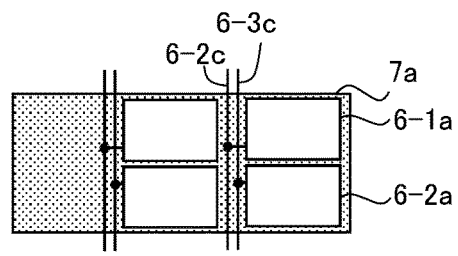
FIG. 7D illustrates still another exemplary modification of the first electrode pads.

As still another example, FIG. 7C illustrates a configuration in which two first electrode pads 6-1a and 6-2a opposed to one second electrode 7a are arrayed in the first direction in an area that overlaps the second electrode 7a in plan view. FIG. 7D illustrates a configuration in which two columns each of which is composed of the first electrode pads 6-1a and 6-2a illustrated in FIG. 7C are arrayed in the second direction.

Figure 7E:
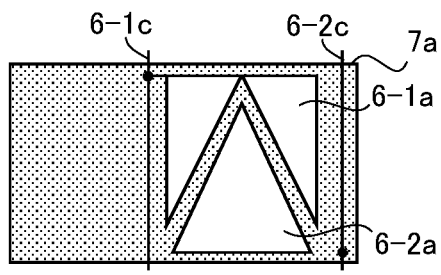
FIG. 7E illustrates still another exemplary modification of the first electrode pads.
Figure 7F:
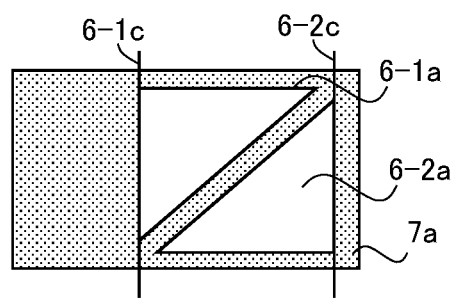
FIG. 7F illustrates still another exemplary modification of the first electrode pads.

Further, the shape of the first electrode 6 is not limited to those of the above-described examples. FIGS. 7E and 7F illustrate examples in cases where each of the first electrode pads 6 in the area R2 is formed in a triangular shape. In the examples illustrated in FIGS. 7E and 7F, a plurality of first electrode pads 6-1a and 6-2a in the area R2, which are opposed to one second electrode 7a, are formed in triangular shapes.

In FIG. 7F, the first electrode pads 6-1a and 6-2a are arranged in such a manner that the hypotenuses of the two right angled triangles that form the first electrode pads 6-1a, and the two equal-length sides of the isosceles triangle that forms the first electrode pad 6-2a, are opposed in the first direction.

In the example illustrated in FIG. 7F, the first electrode pads 6-1a and 6-2a are arranged in such a manner that the hypotenuse of the right angled triangle that forms the first electrode pad 6-1a, and the hypotenuse of the right angled triangle that forms the first electrode pad 6-2a, are opposed in the first direction.

Embodiment 2

Figure 8:
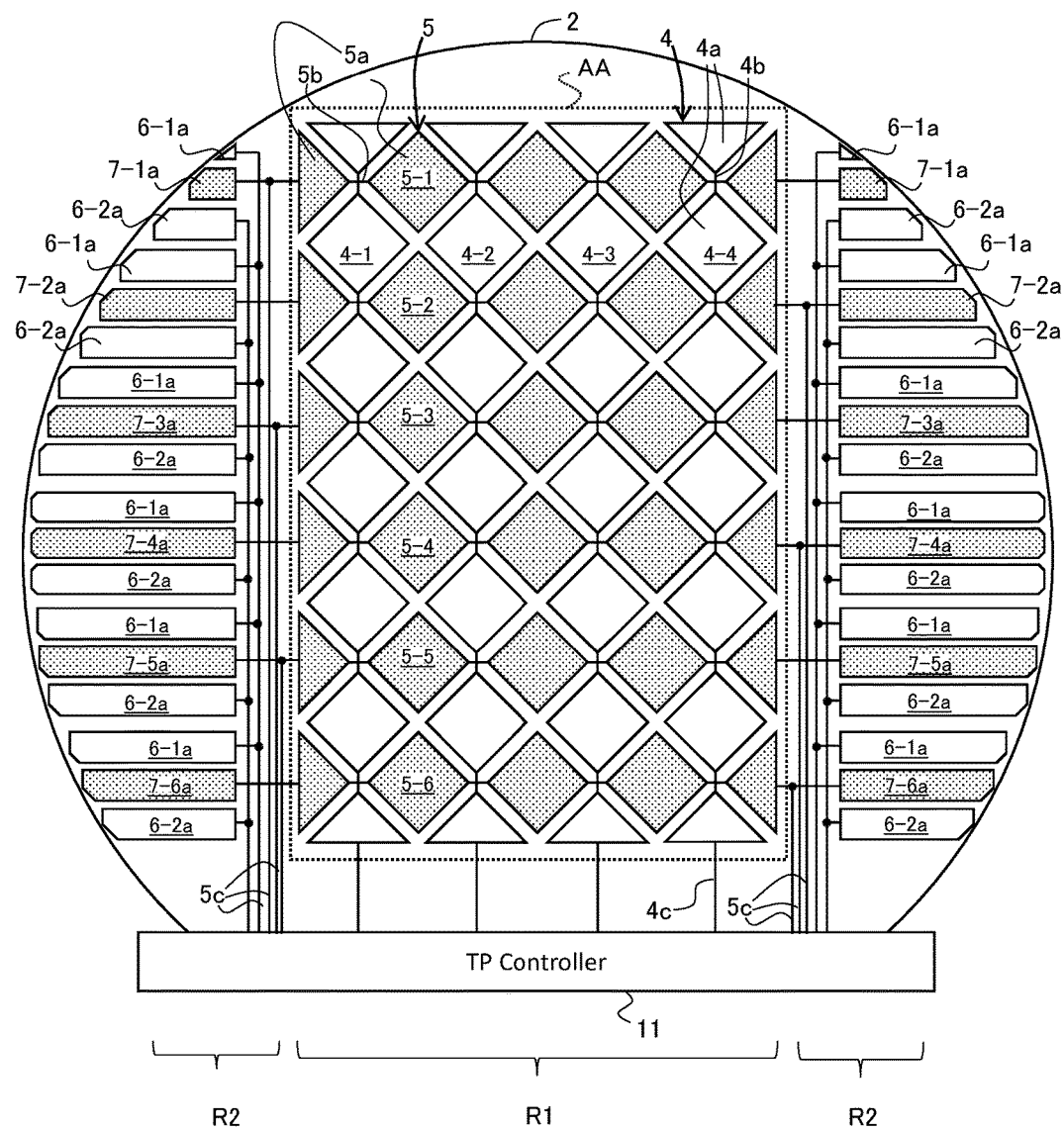
FIG. 8 illustrates an exemplary configuration in a case where the first electrodes 4, 6 and the second electrodes 5, 7 illustrated in FIG. 2 are applied to a non-rectangular touch panel.

The touch panel 2 in the above-described embodiment can be applied to a non-rectangular touch panel. FIG. 8 illustrates an exemplary configuration in a case where the configuration of the first electrodes 4, 6 and the second electrodes 5, 7 in Embodiment 1 described above, illustrated in FIG. 2, is applied to a non-rectangular touch panel. In the example illustrated in FIG. 8, an outer edge part of the touch panel 2 is curved. The frame area outside the display area AA is in a non-rectangular shape. On outer sides of an area R1 that overlaps the display area AA, lines 5c of second electrodes 5-1 to 5-6 are arranged so as to be along the display area AA. On further outer sides, in spaces between the lines 5c and the outer edge of the touch panel 2, there are arrange second electrode pads 7-1a to 7-6a and a plurality of first electrode pads 6-1a and 6-2a that are opposed to these second electrode pads 7-1a to 7-6a. The ends of the second electrode pads 7-1a to 7-6a and the first electrode pads 6-1a and 6-2a are in shapes along the shape of the outer edge of the touch panel 2.

Embodiment 3

In Embodiments 1 and 2 described above, the configuration is such that all of the second electrodes 5 in the area R1 are connected with the second electrodes 7 in the areas R2. As a modification example, the configuration may be such that part of the second electrodes 5 in the areas R1 are connected to the second electrodes 7 in the areas R2. Alternatively, the configuration may be such that the second electrodes 5 in the area R1, and the second electrodes 7 in the areas R2 are not connected, but they are provided independently.

Figure 9:
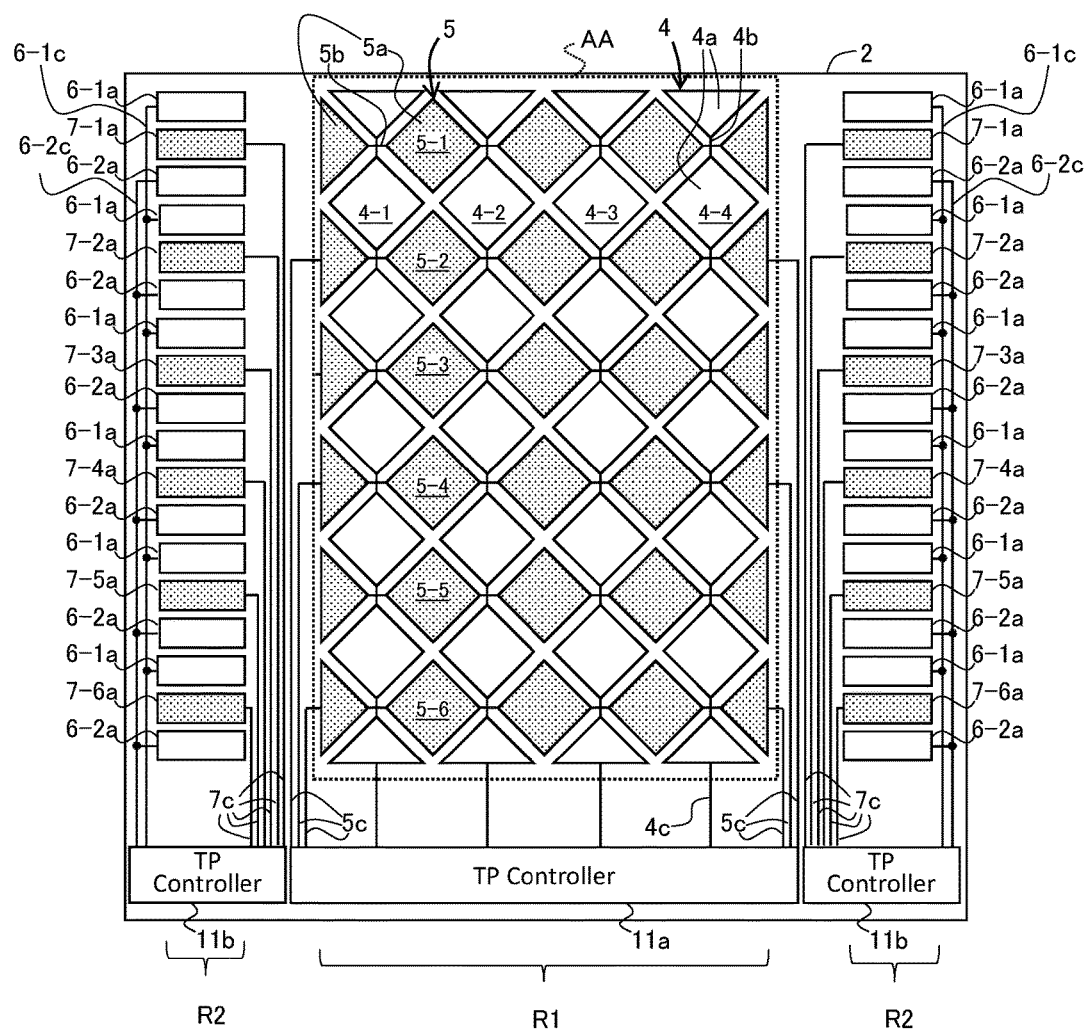
FIG. 9 illustrates an exemplary configuration in which the second electrodes 5 in the area R1 and the second electrodes 7 in the areas R2 are independently provided.

FIG. 9 illustrates an exemplary configuration in which the second electrodes 5 in the area R1 and the second electrodes 7 in the areas R2 are independently provided. In FIG. 9, the electrode configuration in the area R1 can be the same as that illustrated in FIG. 2. The second electrodes 5-1 to 5-6 in the area R1 are connected to a TP controller 11a through the lines 5c arranged in areas outside the area R1. The configurations of the first electrode pads 6-1a and 6-2a, the lines 6-1c and 6-2c thereof, and, the second electrode pads 7-1a to 7-6a in the areas R2 can be the same as that illustrated in FIG. 2. The second electrode pads 7-1a to 7-6a are connected to TP controllers 11b through the lines 7c provided in the areas R2.

In the example illustrated in FIG. 9, the TP controller 11a to which the first electrodes 4 and the second electrodes 5 in the area R1 are connected, and the TP controller 11b to which the first electrodes 6 and the second electrodes 7 in the areas R2 are connected, are different. In other words, the first TP controller 11a, which controls signals of the first electrodes 4 and the second electrodes 5 in the area R1 and detects an object in the area R1, and the second TP controllers 11b, which controls signals of the first electrodes 6 and the second electrodes 7 in the areas R2 and detects an object in the areas R2, are provided individually. The first TP controller 11a and the second TP controllers 11b can be formed with, for example, individual semiconductor chips, respectively. Alternatively, the first TP controller 11a and the second TP controllers 11b may be formed with, for example, identical semiconductor chips, and the system configuration may be such that they can be independently driven.

By independently providing the first TP controller 11a that controls or processes signals of the electrodes in the area R1 and the second TP controllers 11b that controls or processes signals of the electrodes in the area R2 in this way, the driving in accordance with respective detection properties of the area R1 and the area R2 is facilitated.

For example, the configuration may be such that the TP controller 11a is of a mutual capacitance type and detects a capacitance between the first electrodes 4 and the second electrodes 5 in the area R1, and the TP controller 11b is of a self-capacitance type and detects capacitances of the first electrodes 6 and the second electrodes 7 in the areas R2. The mutual capacitance type determines a change in the electrostatic capacitance between the first electrode and the second electrode so as to detect approach or contact of an object. The self-capacitance type determines respective electrostatic capacitances coupled with the first electrode and the second electrode so as to detect approach or contact of an object. By using different detection types in the areas R1 and R2, different detection performances can be achieved in the areas R1 and R2. For example, contact of an object can be detected in the area R1, and highly-sensitive detection such as hover detection, or highly accurate detection for fingerprint authentication or the like can be performed in the areas R2.

Embodiment 4

In the touch panels 2 according to Embodiments 1 to 3, third electrodes can be provided additionally at positions that overlaps the first electrodes 6 or the second electrodes 7 in the area R2. With this, for example, a sensor that is capable of detecting an object can be formed with the third electrodes, and the first electrodes 6 or the second electrodes 7.

Figure 10A:
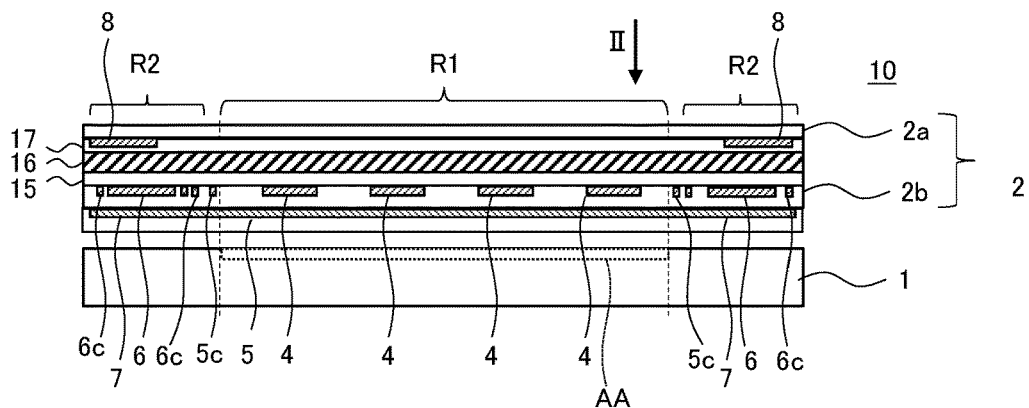
FIG. 10A is a cross-sectional view illustrating an exemplary configuration in a case where third electrodes are provided on the touch panel 2 illustrated in FIGS. 3 and 4.
Figure 10B:
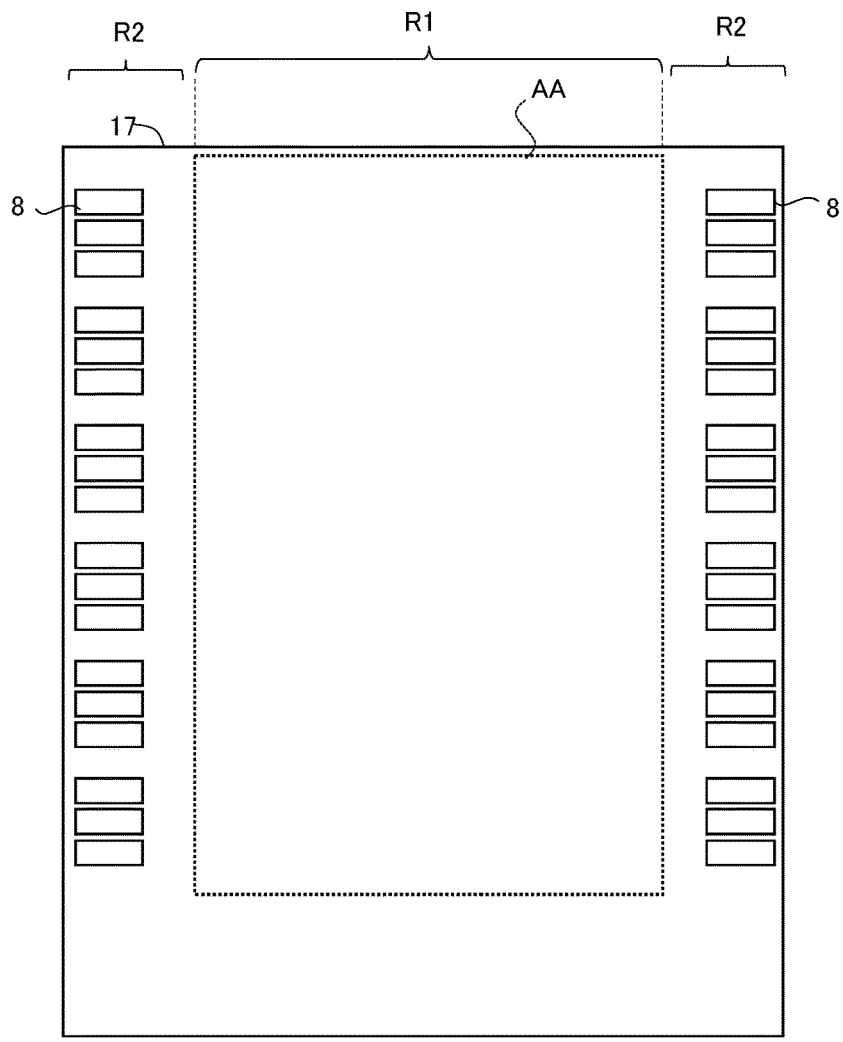
FIG. 10B illustrates an arrangement of the third electrodes 8 on the touch panel 2 illustrated in FIG. 10A, when viewed in the direction II vertical to the display surface.

FIG. 10A is a cross-sectional view illustrating an exemplary configuration in a case where third electrodes are provided additionally on the touch panel 2 illustrated in FIGS. 3 and 4. In the example illustrated in FIG. 10A, the third electrodes 8 are provided at positions that overlap the first electrodes 6 when viewed in a direction II vertical the display surface of the display area AA. Between the first electrodes 6 and the third electrodes 8, an insulating layer 15, an elastomer layer 16, and an insulating layer 17 are formed in the stated order. FIG. 10B illustrates an arrangement of the third electrodes 8 on the touch panel 2 illustrated in FIG. 10A, when viewed in the direction II vertical to the display surface. In the example illustrated in FIG. 10B, the third electrodes 8 are arranged in the areas R2, that is, in the frame areas outside the display area AA, in the first direction along the edges of the touch panel 2. The example illustrated in FIGS. 10A and 10B has the configuration of the example illustrated in FIGS. 3 and 4 further including the third electrodes 8, but similarly, it may have the configuration illustrated in FIGS. 1 and 2 further including the third electrodes 8.

In the example illustrated in FIG. 10A, since the elastomer layer 16 is present between the first electrodes 6 and the third electrodes 8 in the areas R2, the distance between the first electrodes 6 and the third electrodes 8 changes according to contact of an object. By detecting a change in the capacitances that occurs in response to a change in the distance between the first electrodes 6 and the third electrodes 8, the contact of an object in the areas R2 can be detected.

The configuration of the sensor in which the third electrodes 8 are used is not limited to that of the above-described example. For example, in place of the elastomer layer 16, a piezoelectric film may be arranged, whereby a pressure sensor can be formed in the area R2. Alternatively, a touch detection sensor can be formed with the third electrodes 8 and the first electrodes 6. For example, it is possible that a touch sensor with accuracy higher than that in the area R1 can be formed with the third electrodes 8 and the first electrodes 6 in the areas R2, so that fingerprint authentication or the like can be performed in the areas R2. Further alternatively, a sensor with sensitivity higher than that in the area R1 can be formed with the third electrodes 8 and the first electrodes 6, so that hover detection or the like can be performed in the area R2. Still further alternatively, the third electrodes 8 may be arranged on edges of the display device 10, whereby a sensor that detects contact or approach of an object on the edge can be formed.

Embodiment 5

Figure 11:
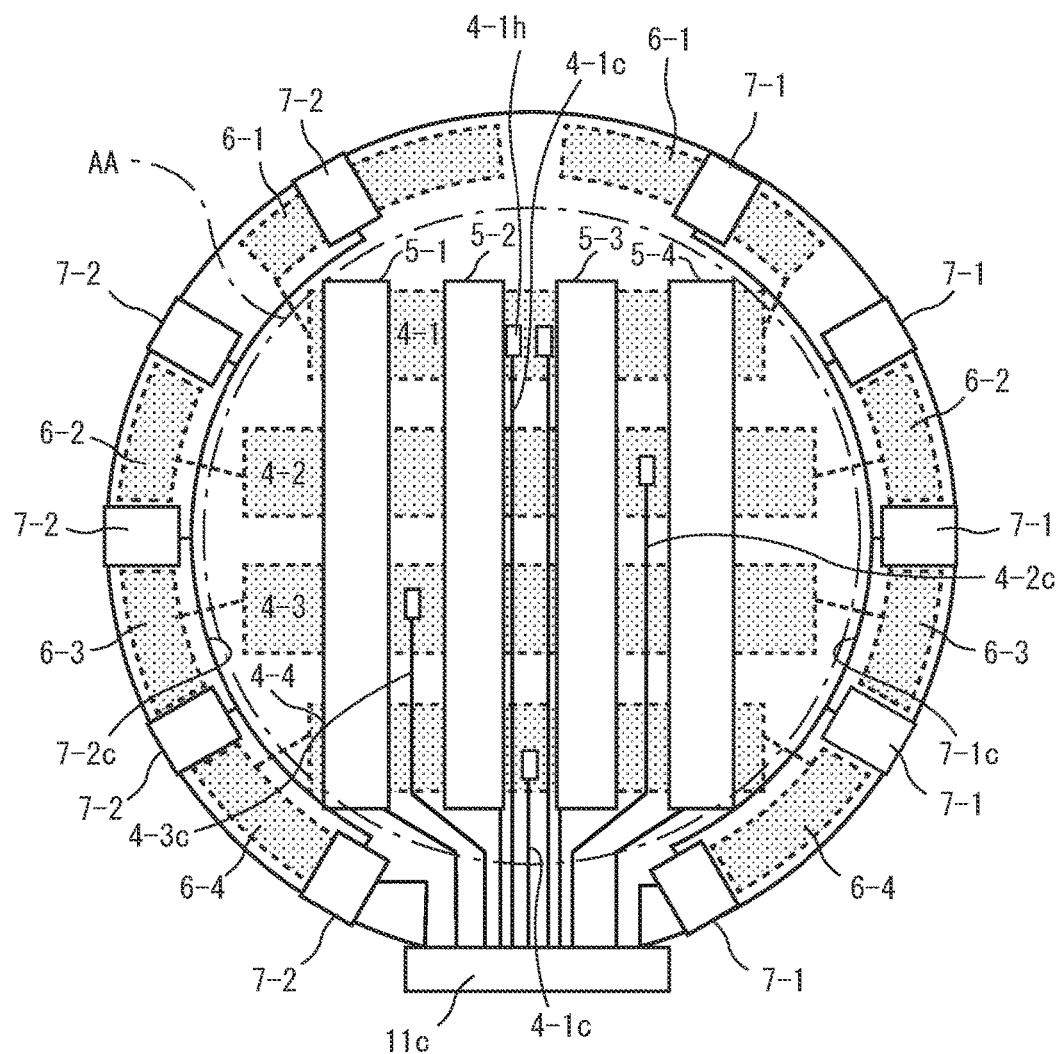
FIG. 11 illustrates a exemplary modification of the first electrodes 6 and the second electrodes 7 in the areas R2.

FIG. 11 illustrates a exemplary modification of the first electrodes 6 and the second electrodes 7 in the areas R2. In the example illustrated in FIG. 11, the shapes of the touch panel 2 and the display area AA viewed in a direction vertical to the display surface are non-rectangular shapes. More specifically, the edges (ends) of the touch panel 2 and the display area AA include curved parts. In this example, the touch panel 2 is in a circular shape, but, for example, it may be in a shape that includes a curve part and a linear part.

In an area that overlaps the display area AA, that is, an area R1, the following are arranged: first electrodes 4-1 to 4-4 extending in a first direction (the transverse direction, that is, the horizontal direction of the display screen, as an example, in FIG. 11); and second electrodes 5-1 to 5-4 extending in a second direction intersecting with the first direction (the longitudinal direction, that is, the vertical direction of the display screen, as an example, in FIG. 11). The first electrodes 4-1 to 4-4 and the second electrodes 5-1 to 5-4 are provided in different layers. For example, the first electrode 4-1 is connected, through a through hole 4-1h, to a line 4-1c arranged in a different layer. The line 4-1c is connected to a TP controller 11c provided at an end part of the touch panel 2.

In a frame area, that is, areas R2 outside the area R1, a plurality of electrode pads 6-1 to 6-4 of the first electrodes 6, and a plurality of electrode pads 7-1 and 7-2 of the second electrodes 7 are alternately arranged along the edge of the touch panel 2. In this example, two electrode pads (for example, 6-2, 6-3) of the first electrodes are provided so as to be opposed to one electrode pad (for example, 7-1) of the second electrodes. The two electrode pads (for example, 6-2, 6-3) of the first electrode opposed to one electrode pad 7-1 of the second electrodes are arranged along the edge of the touch panel 2. More specifically, in the area R2, two first electrodes (for example, 6-2, 6-3) are provided along the edge (outline) of the touch panel 2 so that the second electrode 7-1 is interposed between the same on both sides.

The plurality of electrode pads 6-1 to 6-4 of the first electrode in each electrode pad area R2 are connected to the plurality of first electrodes 4-1 to 4-4 in the area R1, respectively. More specifically, the plurality of electrode pads 6-1 to 6-4 of the first electrode in the area R2 are connected, through respective lines, to the TP controller 11c as an example of the control unit. The second electrode pads 7-1 and 7-2 in the area R2 are connected, through lines 7-1c and 7-2c arranged along the display area AA, to the TP controller 11c.

Figure 12:
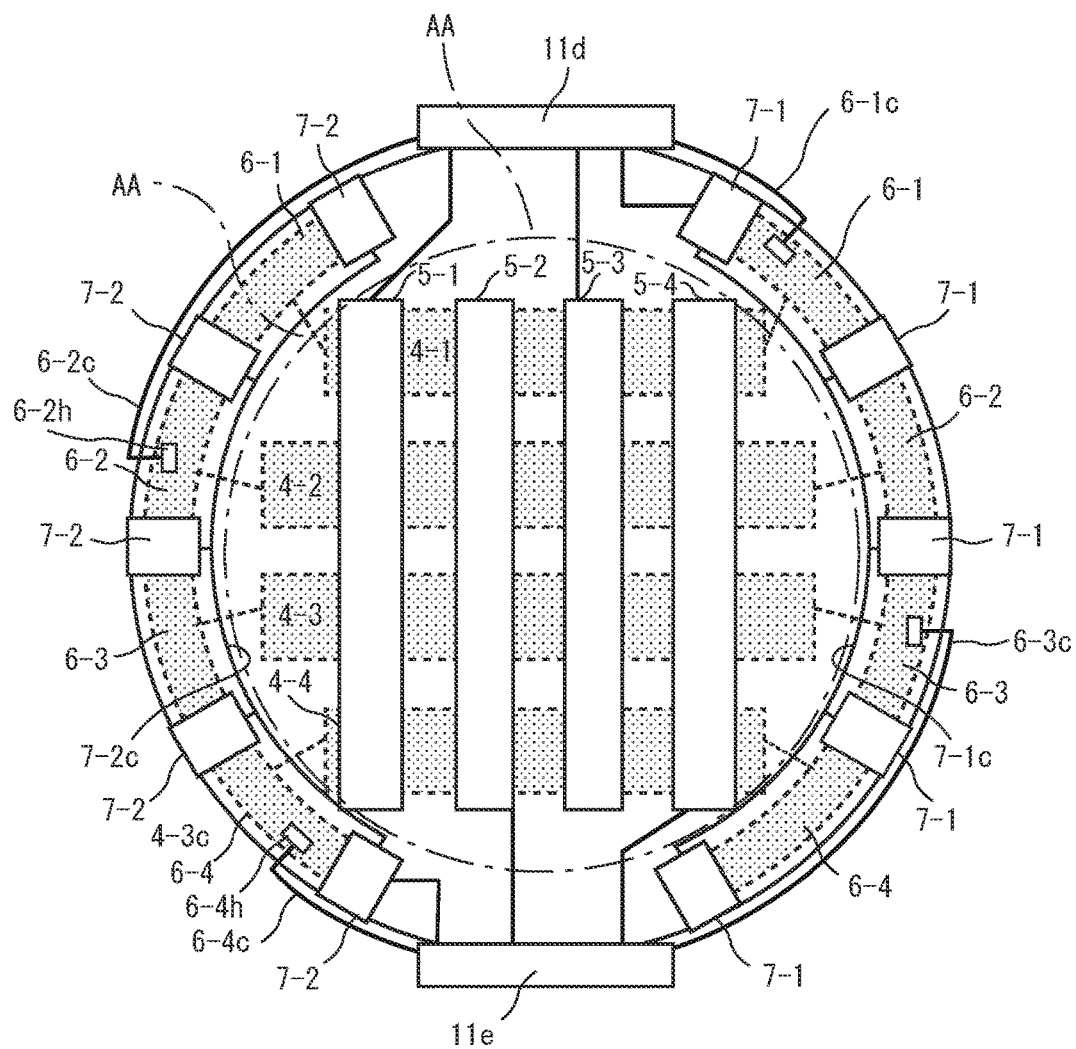
FIG. 12 illustrates a modification example of the touch panel illustrated in FIG. 11.

FIG. 12 illustrates a modification example of the touch panel 2 illustrated in FIG. 11. In the example illustrated in FIG. 12, two TP controllers 11d and 11e are provided at such positions that they are opposed to each other so that the display area AA is interposed therebetween. The electrode pads 6-1 to 6-4 of the second electrodes in the areas R2 are connected to individual lines 6-1c to 6-4c arranged in the areas R2, respectively. Respective ends of the first electrodes 4-1 to 4-4 in the area R1 are connected to the first electrodes 6-1 to 6-4 in the areas R2, respectively. To one of the two first electrodes 6-1 connected to the respective ends of the first electrode 4-1, the line 6-1c is connected. The lines 6-1c to 6-4c are formed so as to extend along the edge of the touch panel 2, on the outer sides of the electrode pads 6-1 to 6-4 of the first electrodes. By providing the two TP controllers 11d and 11e at opposed positions in this way, the lengths of the lines 6-1c to 6-4c can be decreased. This enables more efficient line arrangement.

In a case where the shapes of the touch panel 2 and the display area AA are not rectangular shapes but include curved portions in the edges (outlines) thereof as in the present embodiment, the first electrodes 6 and the second electrode 7 arranged so that one second electrode 7 is interposed between two first electrodes 6 can be arranged in the areas R2 along the curves of the edge of the display area AA or the touch panel 2. This makes it possible to, in a non-rectangular touch panel as well, efficiently arrange the electrodes in the frame area outside the display area AA. In this way, the two or more first electrodes 6 provided so as to be opposed to one second electrode 7 in the area R2 can be arrayed, not exclusively in the first direction, but, for example, in the second direction, or in a direction different from both of the first direction and the second direction.

Other Modification Examples

Figure 13:
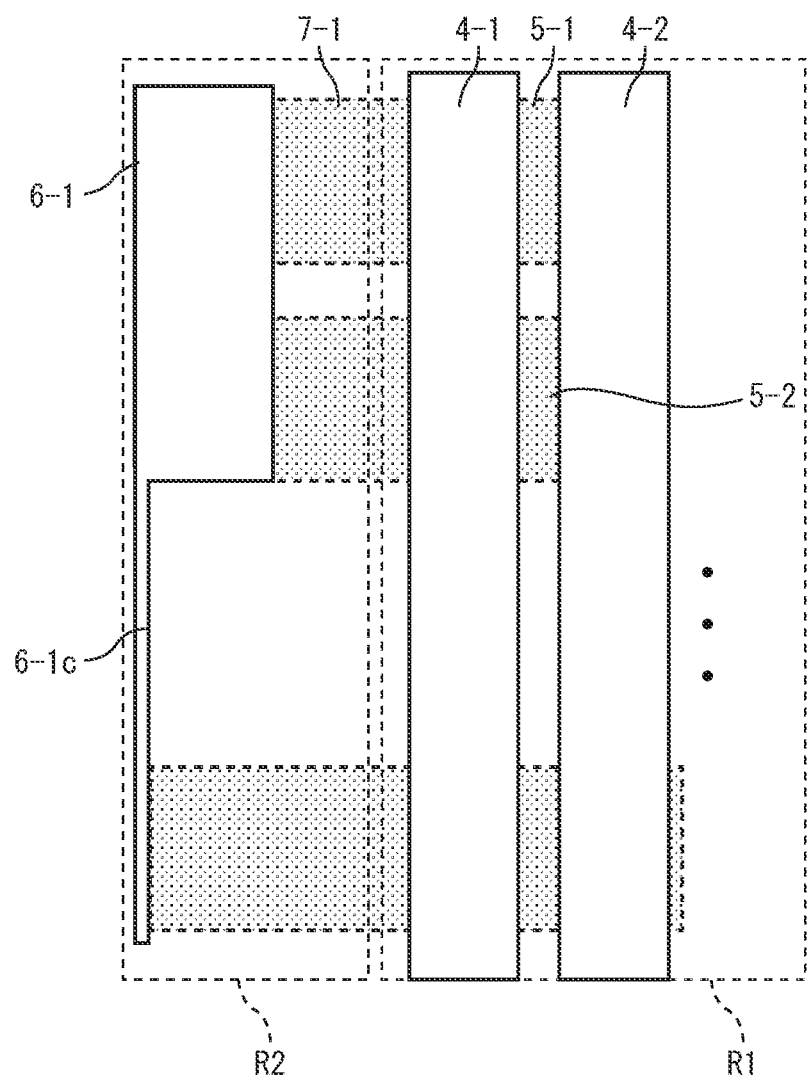
FIG. 13 illustrates an exemplary modification of electrode pads of the first electrodes in the area R2 in the configuration illustrated in FIG. 1.

The embodiment of the present invention is not limited to Embodiments 1 to 5. For example, in the areas R2, the configuration can be such that one electrode pad of the first electrodes is opposed to at least one second electrode. FIG. 13 illustrates an exemplary modification of the electrode pads of the first electrodes in the area R2 in the configuration illustrated in FIG. 1. In the example illustrated in FIG. 13, in the areas R2, one electrode pad 6-1 of the first electrodes 6 is provided at such a position that the electrode pad 6-1 is opposed to two second electrodes 7-1 extending in the second direction. The electrode pad 6-1 is connected with the TP controller 11, through the line 6-1c extending in the first direction.

Further, for example, the touch panel 2 can have such a configuration that contact or approach of an object at an edge of the transparent cover 2a is detected by the first electrodes 6 and the second electrodes 7 in the areas R2. In the above-described embodiments 1 to 5, it is possible to improve the detection accuracy in the frame area, without an increase in the number of lines in a frame area outside an area overlapping the display area AA. This enables, for example, highly accurate edge detection. Besides, this makes it possible to make the object detection accuracy in the display area and the object detection accuracy at the edge of the transparent cover outside the display area different from each other. This makes it possible to realize respective detection properties suitable for object detection, in both of a part of transparent cover that overlaps the display area, and an edge of the transparent cover.

Still further, the first electrodes 4 and the second electrodes 5 in the area R1, and the first electrodes 6 and the second electrodes 7 in the areas R2, can be formed in different layers. This makes it possible to improve the degree of freedom in designing first electrodes and the second electrodes in the area R1 and the areas R2.

In Embodiments 1 to 5, the display panel 1 may include a first display area corresponding to the area R1 of the touch panel 2, and second display areas corresponding to the areas R2 of the touch panel. In this case, the display device 10 can further include the following: a first image generation unit that generates an image to be displayed on the first display area based on the position of an object detected in the area R1 of the touch panel 2; and a first image generation unit that generates an image to be displayed on the second display area based on the position of an object detected in the area R2. This allows the display in the second display area to be controlled independently from the display in the first display area.

Still further, the display panel is not limited to the liquid crystal panel. The display panel may be, for example, an organic EL display, a plasma display, or a display in which electrophoresis or MEMS is used.

Application Example

The embodiments of the present invention encompass various types of electronic apparatuses in which the display device 10 according to any of Embodiments 1 to 5 is incorporated. For example, the display device of the present invention can be applied to smartphones, mobile phones, tablet terminals, game machines, general-purpose computers, remote controllers for various types of apparatuses, digital cameras, video cameras, on-vehicle panels, car navigation systems, television apparatuses, ATMs, electronic bulletin boards, electronic guideboards, electronic whiteboards, and the like. Such various types of electronic apparatuses can include touch panels having appropriate detection performance suitable for the purpose of use of the electronic apparatuses, by mounting thereon the display device 10 according to any of Embodiments 1 to 5.

DESCRIPTION OF REFERENCE NUMERALS 1 display panel
2 touch panel
4 first electrode in first area
5 second electrode in first area
6 first electrode in second area
7 second electrode in second area
4c, 5c, 6c, 7c line
10 display device
11 TP controller

The invention claimed is:

1. A display device comprising:
a display panel that includes a display area that displays an image; and
a touch panel stacked on the display panel, wherein the touch panel includes:
   first electrodes that are provided in a first area that overlaps the display area and extend in a first direction;
   second electrodes that extend in a second direction that intersects with the first direction;
   electrode pads provided in a second area outside the first area, the electrode pads being electrically disconnected from the first electrodes; and
   a controller that detects contact or approach of an object in the first area by detecting capacitances between the first electrodes and the second electrodes or respective capacitances of the first electrodes and the second electrodes,
in the touch panel, a shape of each of the first electrodes in the first area, and a shape of each of the electrode pads in the second area, are different,
at least one of the second electrodes includes an extended portion in the second area,
in the second area, the electrode pads and the extended portion of the at least one of the second electrodes are aligned along an edge of the touch panel in the first direction such that at least two of the electrode pads are opposed to the extended portion of the at least one of the second electrodes,
the at least two of the electrode pads opposing the extended portion of the at least one of the second electrodes are connected to the controller through individual lines, and
the controller further detects contact or approach of an object in the second area by detecting capacitances between the electrode pads and the extended portion or respective capacitances of the electrode pads and the extended portion.

2. The display device according to claim 1, wherein two or more of the electrode pads are connected to one line that extends in the first direction.

3. The display device according to claim 1, wherein a material of the first electrodes or the second electrodes in the first area is different from a material of the electrode pads or the extended portion of the at least one of the second electrodes in the second area.

4. The display device according to claim 1, wherein the controller detects the capacitances between the first electrodes and the second electrodes by a mutual capacitance method in the first area, and detects the capacitances of the electrode pads and the extended portion of the at least one of the second electrodes by a self-capacitance method in the second area.

5. An electronic apparatus comprising the display device according to claim 1.

* * * * *